(12) United States Patent
Lee et al.

(10) Patent No.: US 9,728,231 B1
(45) Date of Patent: Aug. 8, 2017

(54) DEVICE AND METHOD FOR DATA-WRITING

(71) Applicant: TAIWAN SEMICONDUCTOR MANUFACTURING CO., LTD., Hsinchu (TW)

(72) Inventors: Po-Hao Lee, Hsinchu (TW); Yi-Chun Shih, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/145,658

(22) Filed: May 3, 2016

(51) Int. Cl.
*G11C 16/30* (2006.01)
*G11C 5/14* (2006.01)
*G11C 7/14* (2006.01)

(52) U.S. Cl.
CPC .............. *G11C 5/147* (2013.01); *G11C 7/14* (2013.01); *G11C 16/30* (2013.01)

(58) Field of Classification Search
CPC ..................................................... G11C 16/30
USPC ........................................................ 365/226
See application file for complete search history.

(56) References Cited

U.S. PATENT DOCUMENTS

| | | | | |
|---|---|---|---|---|
| 5,249,155 A * | 9/1993 | Arimoto | ................. | G05F 1/465 327/542 |
| 5,485,117 A * | 1/1996 | Furumochi | ............... | G05F 1/56 327/538 |
| 5,504,452 A * | 4/1996 | Takenaka | ............... | G11C 5/147 327/540 |
| 5,612,920 A * | 3/1997 | Tomishima | ...... | G01R 31/31715 365/189.09 |
| 5,956,278 A * | 9/1999 | Itou | ......................... | G11C 5/147 365/189.09 |
| 6,005,819 A * | 12/1999 | Shin | ........................ | G11C 5/14 365/189.09 |
| 6,531,914 B2 * | 3/2003 | Kawakubo | .............. | G05F 1/465 323/315 |
| 7,095,272 B2 * | 8/2006 | Morishita | ............... | G05F 1/465 323/316 |
| 7,181,631 B2 * | 2/2007 | Volk | ......................... | G06F 1/26 713/300 |
| 7,282,989 B2 * | 10/2007 | Byeon | ..................... | G05F 1/465 327/541 |
| 7,417,494 B2 * | 8/2008 | Choi | ....................... | G11C 5/147 327/541 |
| 7,920,405 B2 * | 4/2011 | Kang | ..................... | B82Y 10/00 365/148 |
| 8,253,478 B2 * | 8/2012 | Jung | ....................... | G05F 1/465 327/540 |

(Continued)

OTHER PUBLICATIONS

Sinangil et al., "A 28 nm 2 Mbit 6 T SRAM With Highly Configurable Low-Voltage Write-Ability Assist Implementation and Capacitor-Based Sense-Amplifier Input Offset Compensation", IEEE Journal of Solid-State Circuits, vol. 51, Issue 2, Feb. 2016, pp. 557-567.

*Primary Examiner* — Son Mai
(74) *Attorney, Agent, or Firm* — Maschoff Brennan

(57) ABSTRACT

A device includes a voltage regulator, an auxiliary signal generator, and a circuit cell. The voltage regulator is configured to output a write voltage. The auxiliary signal generator is configured to output an auxiliary signal. The circuit cell is configured to receive both of the write voltage and the auxiliary signal according to a first select signal and a second select signal.

20 Claims, 6 Drawing Sheets

(56) References Cited

U.S. PATENT DOCUMENTS

| | | | |
|---|---|---|---|
| 8,587,369 B2* | 11/2013 | Jang | G05F 1/56 |
| | | | 323/349 |
| 8,760,219 B2* | 6/2014 | Chao | G11C 5/147 |
| | | | 327/540 |
| 2015/0055422 A1 | 2/2015 | Kim | |
| 2015/0262655 A1 | 9/2015 | Hsieh et al. | |
| 2016/0155512 A1* | 6/2016 | Ogawa | G11C 16/30 |
| | | | 365/185.03 |

* cited by examiner

DEVICE AND METHOD FOR DATA-WRITING

BACKGROUND

The semiconductor industry has experienced rapid growth due to improvements in the integration density of a variety of electronic components, including, for example, transistors, diodes, resistors, capacitors, etc. For the most part, this improvement in integration density has come from shrinking the semiconductor process node. Commensurate with shrunken dimensions is an expectation of greater immediacy (higher speed) and increased performance with reduced power consumption. A low-dropout (LDO) regulator is a voltage regulator that introduces a voltage difference between input voltage and output voltage. In the case of memory devices, the voltage difference would cause reliability issues when writing to memory cells due to unstable behavior of transistors therein.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
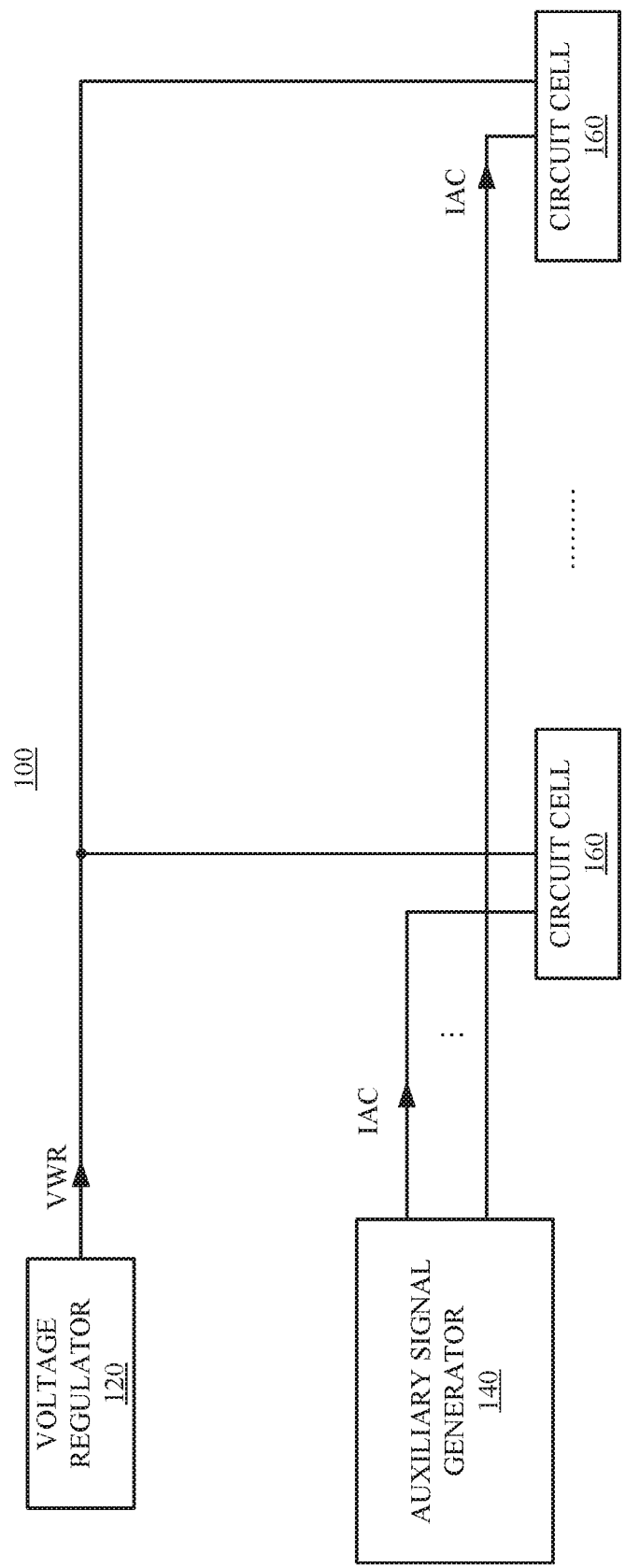
FIG. 1 is a schematic diagram of a device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Reference is now made to FIG. 1. FIG. 1 is a schematic diagram of a device 100, in accordance with some embodiments of the present disclosure. As illustratively shown in FIG. 1, the device 100 includes a voltage regulator 120, an auxiliary signal generator 140, and circuit cells 160. In some embodiments, the voltage regulator 120 is a low dropout (LDO) regulator. The voltage regulator 120 includes an output terminal, and the output terminal of the voltage regulator 120 is configured to output a write voltage VWR to the circuit cells 160. In some embodiments, the circuit cells 160 are I/O cells. In some further embodiments, each I/O cell includes memory devices. In some other embodiments, the circuit cells 160 include various types of emerging memory devices. For example, in further embodiments, the emerging memory devices include a phase-change random access memory (PCRAM), a resistive random access memory (RRAM), a ferroelectric random access memory (FRAM), a magnetic random access memory (MRAM), etc.

The implementations of the voltage regulator 120 and the circuit cells 160 are given for illustrative purposes only. Various implementations of the voltage regulator 120 and the circuit cells 160 are within the contemplated scope of the present disclosure.

The auxiliary signal generator 140 is configured to generate auxiliary signals IAC to the circuit cells 160. In some embodiments, as described above, the circuit cells 160 are memory devices, and bit lines of the memory devices are configured to receive both of the write voltage VWR and the auxiliary signals IAC, to perform a programming operation. In other words, in various embodiments, the write voltage VWR and the auxiliary signal IAC together define a programming voltage of the memory devices. As shown in FIG. 1, the circuit cells 160 are coupled to the output terminal of the voltage regulator 120. Some of the circuit cells 160 are disposed near the output terminal of the voltage regulator 120, and are referred to as "near-end circuit cells" hereinafter. Some of the circuit cells 160 are disposed far from the output terminal of the voltage regulator 120, and are referred to as "far-end circuit cells" hereinafter.

In some approaches, a single voltage regulator is utilized to provide a higher write voltage to the circuit cells to perform the programming operation. In such approaches, when the number of the circuit cells, which are coupled to the output terminal of the single voltage regulator, increases, the parasitic resistances of the transmission wire, connecting the single voltage regulator with the circuit cells, is increased. Accordingly, a voltage drop between the write voltage received by the near-end circuit cells and the write voltage received by the far-end circuit cells is increased due to the parasitic resistances. In other words, the write voltage received by the far-end circuit cells is lower than the write voltage received by the near-end circuit cells. As a result, the settling time of the voltage level of the bit lines of the circuit cells 160 is increased. In certain conditions, the programming operation for the far-end circuit cells would fail.

Compared with such approaches, with the arrangement of the auxiliary signal generator 140, whenever one of the circuit cells 160 is selected to be programmed, the auxiliary signal generator 140 generates the corresponding auxiliary signal IAC to the selected circuit cell 160. Accordingly, the selected circuit cell 160 is programmed according to both of the write voltage VWR and the corresponding auxiliary signal IAC. Effectively, the aforementioned voltage drop is compensated by the auxiliary signal IAC. In other words, the auxiliary signal generator 140 is configured to operate as assisting the programming operation of the selected circuit cell 160. With the arrangement of assisting from the auxiliary signal generator 140, during the programming operation, the bit lines of the circuit cell 160 is able to be charged to the programming voltage with a higher current. Thus, the settling time of the voltage level of the bit lines of the circuit cells 160 is able to be reduced.

Furthermore, as described above, in the approaches using the single voltage regulator, a higher write voltage is generated to perform the programming operation. Thus, the voltage drop between the write voltage received by the near-end circuit cells and the write voltage received by the far-end circuit cells is increased. Compared with such approaches, with the assist of the auxiliary signal IAC, the voltage level of the write voltage VWR in FIG. 1 is able to be reduced. As a result, the voltage drop between the write voltage VWR received by the near-end circuit cells and the write voltage VWR received by the far-end circuit cells is able to be reduced.

The following paragraphs describe certain embodiments related to the device 100 to illustrate functions and applications thereof. However, the present disclosure is not limited to the following embodiments. Various configurations are able to implement the functions and the operations of the device 100 in FIG. 1 are within the contemplated scope of the present disclosure.

Figure 2:
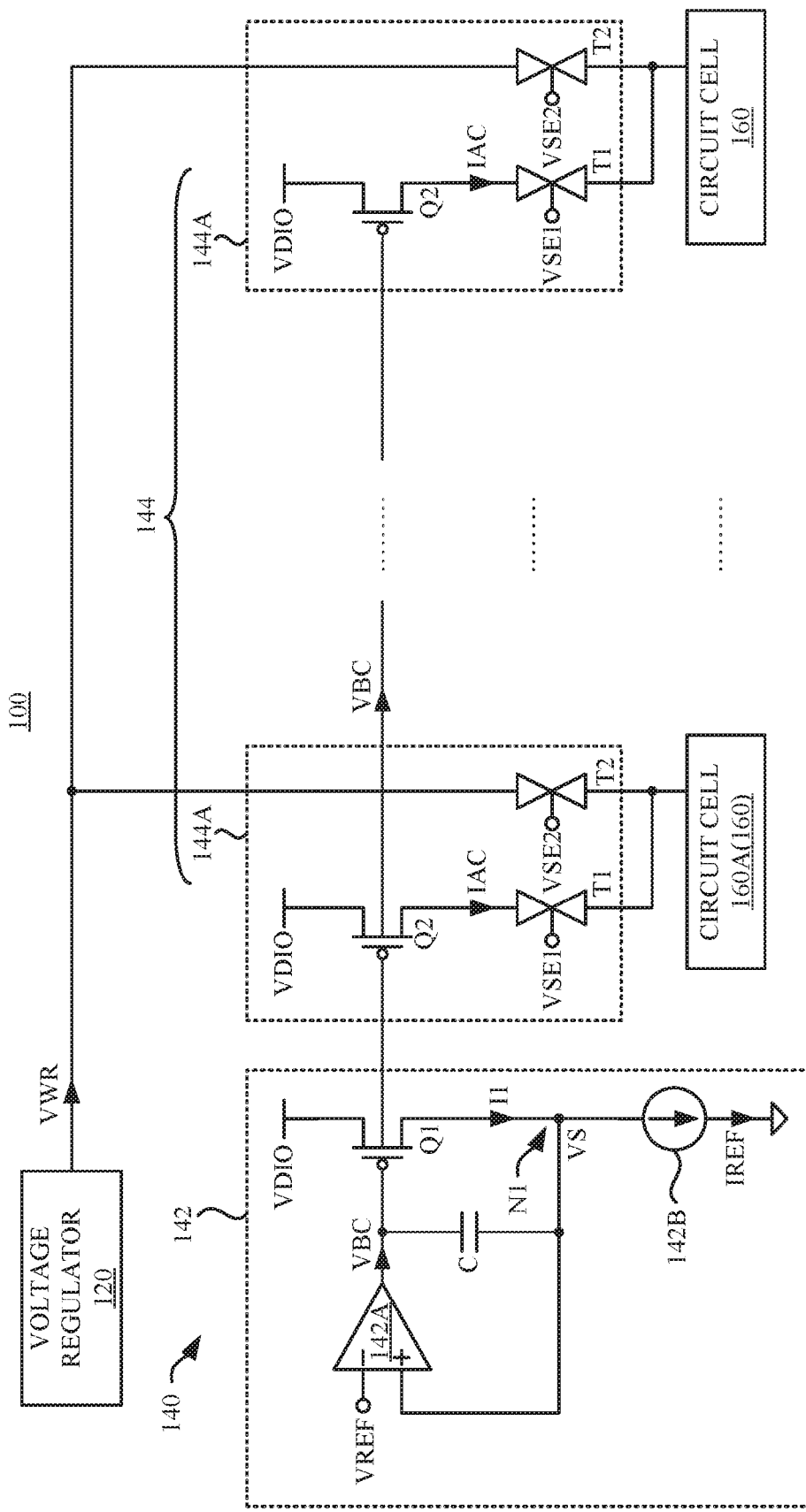
FIG. 2 is a circuit diagram of the device in FIG. 1, in accordance with some embodiments of the present disclosure.

Reference is now made to FIG. 2. FIG. 2 is a circuit diagram of the device 100 in FIG. 1, in accordance with some embodiments of the present disclosure. With respect to the embodiments of FIG. 1, like elements in FIG. 2 are designated with the same reference numbers for ease of understanding.

As illustratively shown in FIG. 2, the auxiliary signal generator 140 includes a control signal generator 142 and a current generating circuit 144. The control signal generator 142 is configured to output a control voltage VBC according to a reference voltage VREF and a reference current IREF. In some embodiments, the control signal generator 142 includes an amplifier 142A, a capacitor C, a switch Q1, and a current source 142B. In some embodiments, the amplifier 142A is configured to generate the control voltage VBC according to the reference voltage VREF and a sensing voltage VS at a node N1. The switch Q1 is biased by a voltage VDIO, and is configured to generate the sensing voltage VS to the node N1 according to the control voltage VBC. The current source 142B is coupled between the node N1 and ground. The current source 142B is configured to generate the reference current IREF flowing from the node N1 to ground. In some embodiments, the current source 142B is implemented with an external current generator. In some embodiments, the current source 142B is implemented with one and/or more transistors. In some alternative embodiments, the current source 142B is implemented with various types of current mirror circuit. In some further embodiments, the current source 142B is implemented with temperature independent reference circuits.

The arrangements of the current source are given for illustrative purposes only. Various arrangements of the current source are within the contemplated scope of the present disclosure.

For illustration of FIG. 2, in some embodiments, the switch Q1 is configured to generate a current I1 according to the control voltage VBC. When the current I1 is different from the reference current IREF, a voltage drop is accordingly generated. Effectively, the sensing voltage VS is generated at the node N1, and is varied with the difference between the current I1 and the current IREF. In some embodiments, the control signal generator 142 is configured to operate as a feedback circuit. For illustration of FIG. 2, a first input terminal of the amplifier 142A is configured to receive the reference voltage VREF, and a second input terminal of the amplifier 142A is coupled to the node N1 to receive the sensing voltage VS. An output terminal of the amplifier 142A is configured to generate the control voltage VBC. In other words, the sensing voltage VS is configured to be a feedback signal of the amplifier 142A. With such arrangement, the current I1 is converged to be about the same as the reference current IREF, and thus the control voltage VBC is settled to a fixed value.

The arrangements of the control signal generator 142 are given for illustrative purposes only. Various arrangements of the control signal generator 142 are within the contemplated scope of the present disclosure. For example, in some other embodiments, the control signal generator 142 in FIG. 2 is able to generate the control voltage VBC without the capacitor C.

In some embodiments, the current generating circuit 144 includes driving branches 144A. Each of the driving branches 144A is coupled to a corresponding circuit cell 160. In greater detail, for illustration of FIG. 2, each of the driving branches 144A includes a switch Q2, a switch T1, and a switch T2. In some embodiments, the switches Q2 in the driving branches 144A and the switch Q1 of the control signal generator 142 are configured to operate as a current mirror circuit. The switch Q2 is biased by the voltage VDIO, and is configured to generate the auxiliary signal IAC. The switch T1 is coupled between the switch Q2 and the corresponding circuit cell 160. The switch T1 is configured to be turned on, according to a select signal VSE1, to transmit the auxiliary signal IAC to the corresponding circuit cell 160. The switch T2 is coupled between the output terminal of the voltage regulator 120 and the corresponding circuit cell 160. The switch T2 is configured to be turned on, according to a select signal VSE2, to transmit the write voltage VWR to the corresponding circuit cell 160. In some embodiments, the select signal VSE1 and the select signal VSE2 are generated by a write driver for the memory devices in the circuit cells 160. In some other embodiments, the select signal VSE1 and the select signal VSE2 are generated by an independent controller.

The arrangements of generating the select signal VSE1 and the select signal VSE2 are given for illustrative purposes only. Various arrangements of generating the select signal VSE1 and the select signal VSE2 are with the contemplated scope of the present disclosure.

With continued reference to FIG. 2, in some embodiments, the switch Q2 is configured to generate a current, i.e., the auxiliary signal IAC, according to the control voltage VBC. In some embodiments, the switch T1 and the switch T2 are implemented with transistors. In some other embodiments, the switch T1 and the switch T2 are implemented with pass gate logic circuits. For illustration of FIG. 2, in some alternative embodiments, the switch T1 and the switch T2 are implemented with transmission gate logic circuits. When one of the circuit cells 160 is selected to be programmed, the corresponding switches T1 and T2 are turned on, to transmit the auxiliary signal IAC and the control voltage VBC to the corresponding circuit cell 160.

In some embodiments, the term "switch" in the present disclosure is implemented with one or more transistors. In some embodiments, the transistors include bipolar junction transistors. In some alternative embodiments, the transistors include field-effect transistors (FETs), which include, for example, junction gate FETs, metal-oxide-semiconductor field-effect transistors (MOSFETs), fin field-effect transistors (FETs), etc. The implementations of the switches in the present disclosure are given for illustrative purposes only. Various types of the transistors, which are able to operate as "switch", are within the contemplated scope of the present disclosure.

Figure 3:
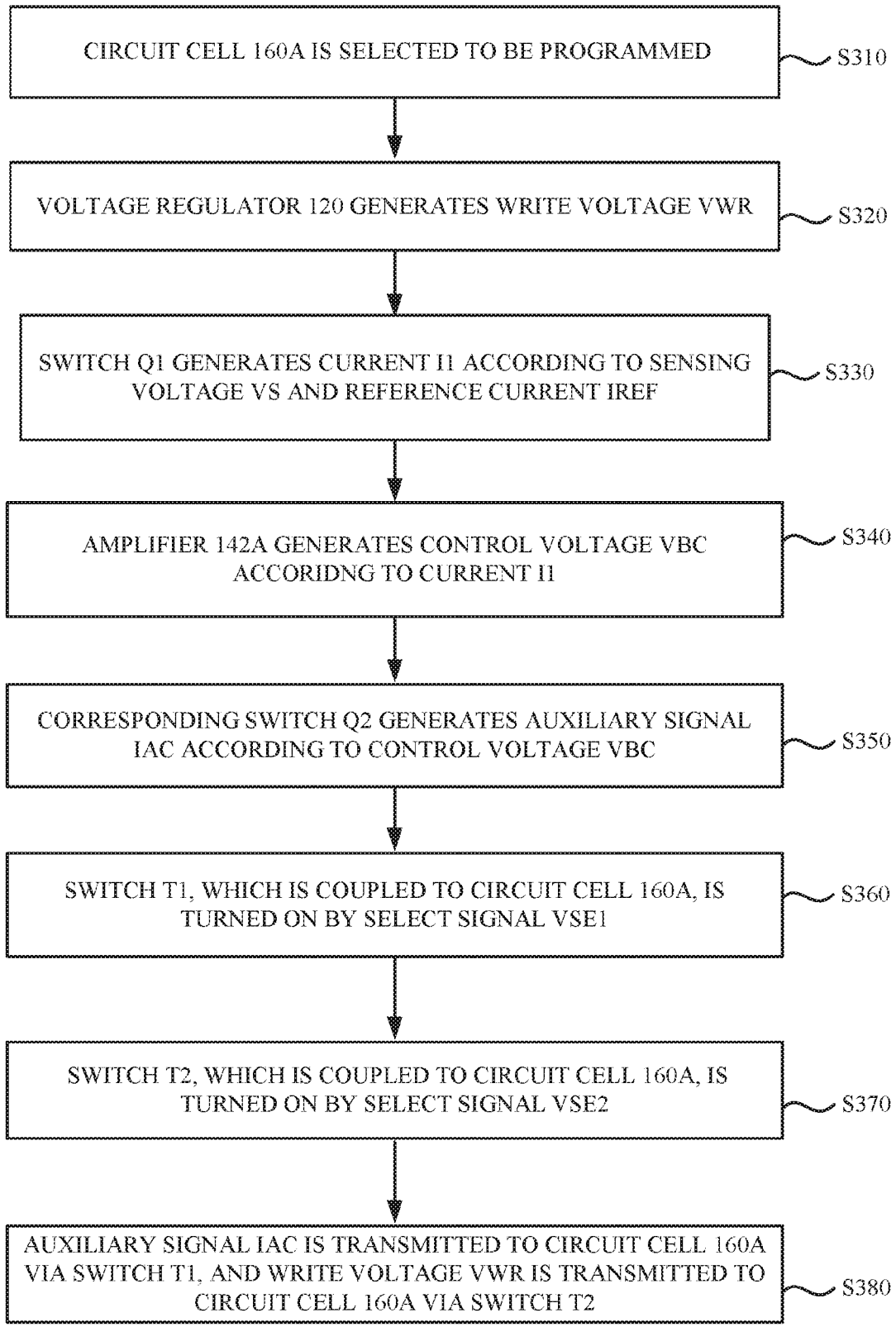
FIG. 3 is a flow chart of a method illustrating operations of the device in FIG. 1, in accordance with some embodiments of the present disclosure.

FIG. 3 is a flow chart of a method 300 illustrating operations of the device 100 in FIG. 1, in accordance with some embodiments of the present disclosure. For ease of understanding, reference is now made to FIGS. 2-3, and the operations of the method 300 are described with the device 100 in FIG. 2. For simplicity, the following descriptions are given with an example in which the circuit cell 160A is to be programmed. In some embodiments, the method 300 includes operations S310-S380.

In operation S310, the circuit cell 160A is selected to be programmed. In operation 5320, the voltage regulator 120 generates the write voltage VWR. In operation 5330, the switch Q1 generates the current I1 according to the sensing voltage VS and the reference current IREF. In operation 5340, the amplifier 142A generates the control voltage VBC according to the current I1.

As described above, the sensing voltage VS is varied with the difference between the current I1 and the current IREF. The current I1 is continuously adjusted to be about the same as the reference current IREF. Accordingly, the control voltage VBC will be settled to a fixed value.

With continued reference to FIG. 3, in operation 5350, the corresponding switch Q2 generates the auxiliary signal IAC according to the control voltage VBC. In operation 5360, the switch T1, which is coupled to the circuit cell 160A, is turned on by the select signal VSE1. In operation 5370, the switch T2, which is coupled to the circuit cell 160A, is turned on by the select signal VSE2. In operation S380, the auxiliary signal IAC is transmitted to the circuit cell 160A via the switch T1, and the write voltage VWR is transmitted to the circuit cell 160A via the switch T2.

For illustration of FIG. 2, when the circuit cell 160A is selected from the circuit cells 160 to be programmed, the corresponding switches T1-T2, which are coupled to the selected circuit cell 160A, are turned on by the select signals VSE1-VSE2, respectively. Accordingly, the switch Q2, which is coupled to the corresponding switch T1, generates the auxiliary signal IAC according to the settled control voltage VBC. Thus, the auxiliary signal IAC and the write voltage VWR are transmitted to the circuit cell 160A via the switches T1-T2, respectively. As a result, the selected circuit cell 160A is able to be programmed according to both of the auxiliary signal IAC and the write voltage VWR.

The above description of the method 300 includes exemplary operations, but the operations of the method 300 are not necessarily performed in the order described. The order of the operations of the method 300 disclosed in the present disclosure are able to be changed, or the operations are able to be executed simultaneously or partially simultaneously as appropriate, in accordance with the spirit and scope of various embodiments of the present disclosure.

Figure 4:
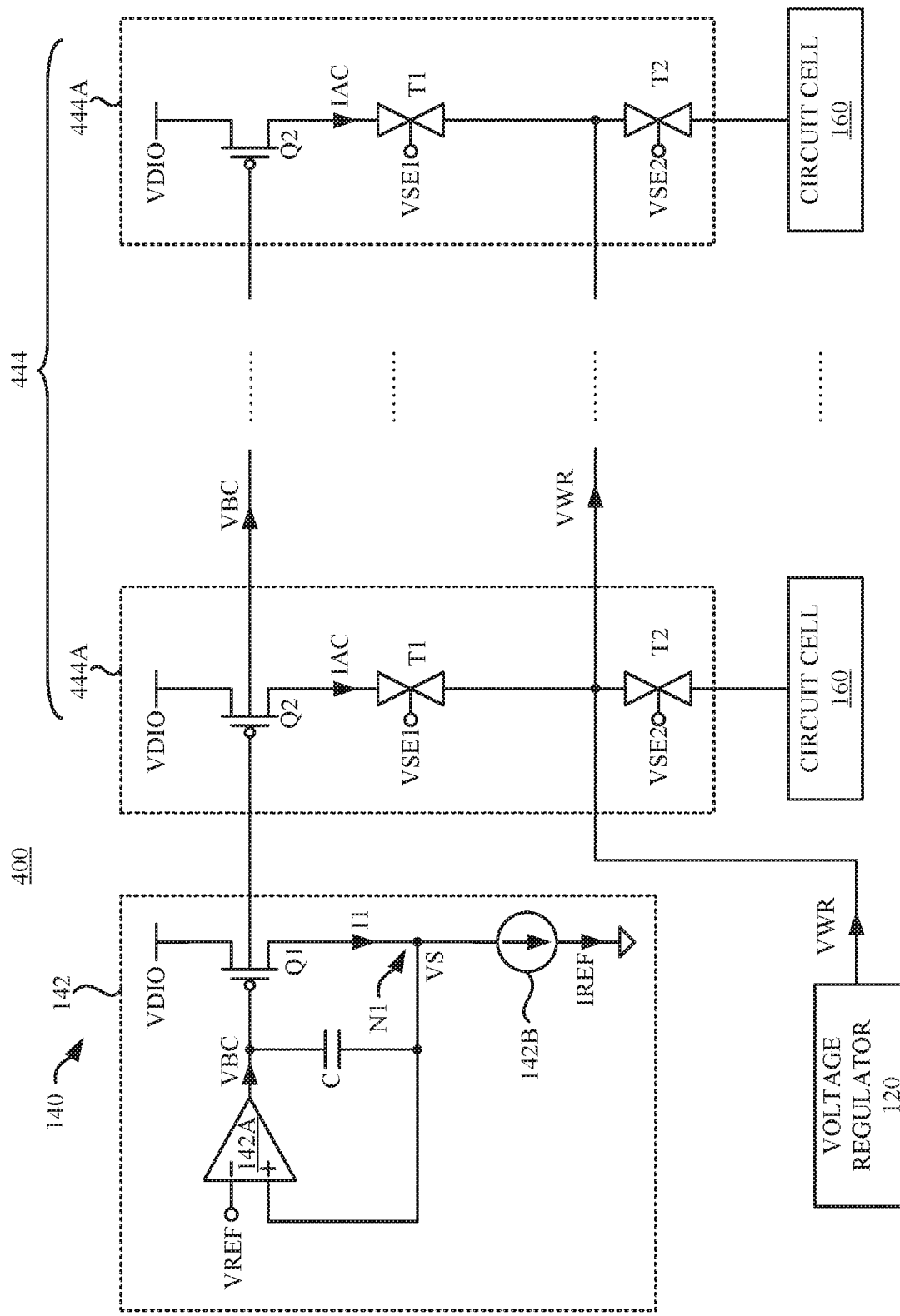
FIG. 4 is a circuit diagram of a device, in accordance with some alternative embodiments of the present disclosure.

Reference is now made to FIG. 4. FIG. 4 is a circuit diagram of a device 400, in accordance with some alternative embodiments of the present disclosure. With respect to the embodiments of FIGS. 1-2, like elements in FIG. 4 are designated with the same reference numbers for ease of understanding.

In some embodiments of FIG. 4, compared with the device 100 in FIG. 2, the auxiliary signal generator 140 of the device 400 includes the control signal generator 142 and a current generating circuit 444. The current generating circuit 444 includes driving branches 444A. The switches T1 of the driving branches 444A are coupled between the output terminal of the voltage regulator 120 and the switches Q2. The switches T2 of the driving branches 444A are coupled between the output terminal of the voltage regulator 120 and the circuit cells 160. In other words, as illustrated in FIG. 4, the switch T1 is configured to be turned on according to the select signal VSE1, to transmit the auxiliary signal IAC to the output terminal of the voltage regulator 120. The switch T2 is configured to be turned on according to the select signal VSE2, to transmit both of the auxiliary signal IAC and the write voltage VWR the corresponding circuit cell 160. Effectively, the circuit cells 160 are able to be programmed according to both of the auxiliary signal IAC and the write voltage VWR.

The related arrangements of the auxiliary signal generator 140 in FIG. 4 are the same as the auxiliary signal generator 140 in FIG. 2. The related operations of the device 400 in FIG. 4 are similar with the operations discussed in the method 300 above. Accordingly, the repetitious descriptions are not given here.

Figure 5:
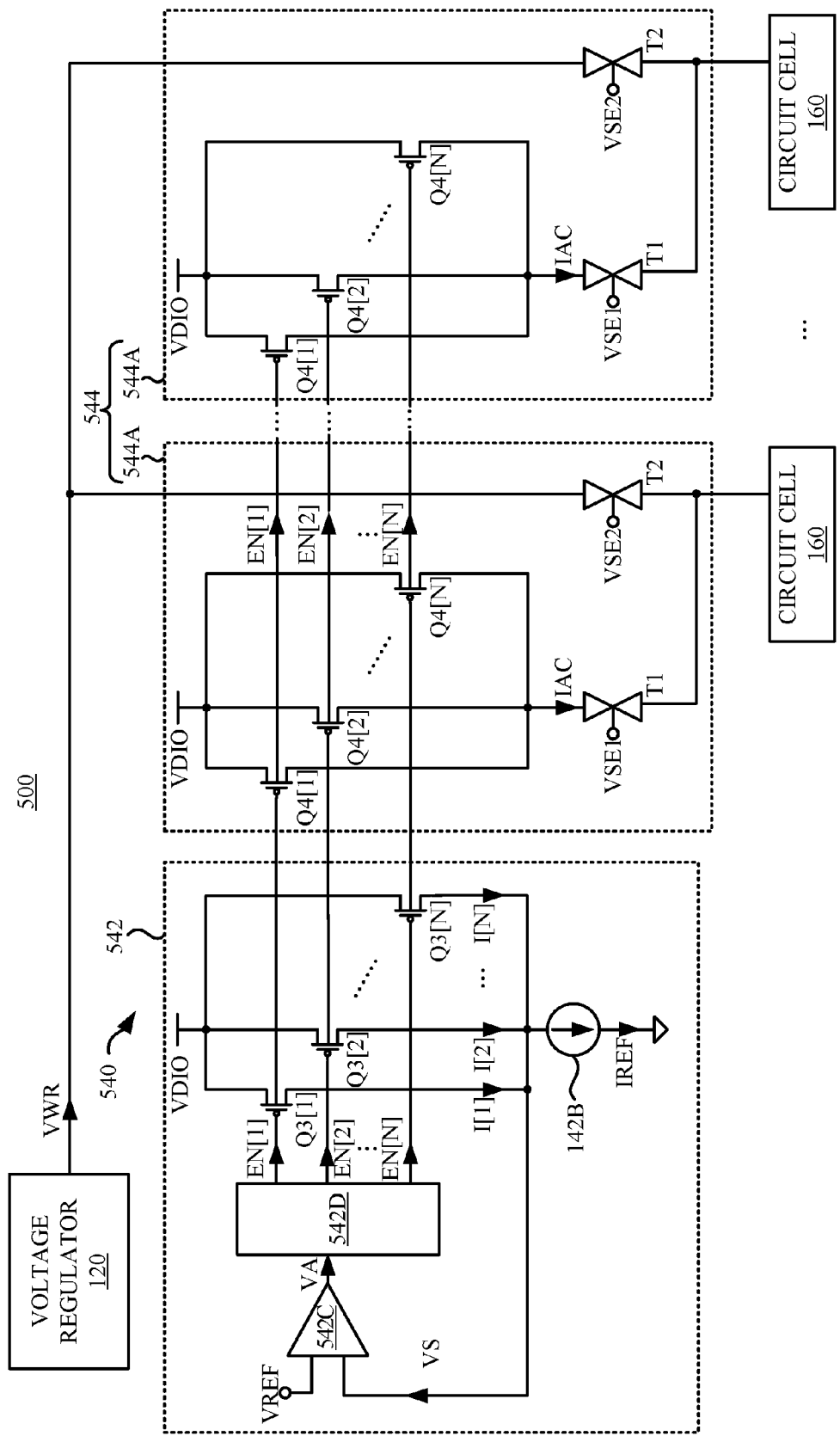
FIG. 5 is a circuit diagram of a device, in accordance with some other embodiments of the present disclosure.

Reference is now made to FIG. 5. FIG. 5 is a circuit diagram of a device 500, in accordance with some other embodiments of the present disclosure. With respect to the embodiments of FIG. 1 and FIG. 2, like elements in FIG. 5 are designated with the same reference numbers for ease of understanding.

In the embodiments described above, the auxiliary signal generator 140 illustrated in FIG. 2 are implemented with analog circuits. The arrangements of the auxiliary signal generator 140 in FIG. 2 are given for illustrative purposes only. Various arrangements of the current source are within the contemplated scope of the present disclosure. For illustration, in some embodiments, the auxiliary signal generator 540 illustrated in FIG. 5 includes a control signal generator 542 and a current generating circuit 544, which are implemented with digital circuits.

As illustratively shown in FIG. 5, the control signal generator 542 is configured to generate control signals EN[1]-EN[N] according to the reference voltage VREF and the reference current IREF, in which N is a positive integer greater than 1. The current generating circuit 544 is configured to generate the auxiliary signal IAC according to the control signals EN[1]-EN[N], and transmit the auxiliary signal IAC to the selected circuit cell 160 according to the select signal VSE1 and the select signal VSE2.

In some embodiments, the control signal generator 542 includes a comparator 542C, a controller 542D, switches Q3[1]-Q3[N], and the current source 142B. An first input terminal of the comparator 542C is configured to receive the reference voltage VREF, a second input terminal of the comparator 542C is coupled to the node N1 to receive the sensing voltage VS, and an output terminal of the comparator 542C is configured to output an adjust signal VA. The comparator 542C is configured to compare the reference voltage VREF with the sensing voltage VS, to generate an adjust signal VA to the controller 542D. The controller 542D is configured to generate the control signals EN[1]-EN[N] according to the adjust signal VA. In some embodiments, the controller 542D is implemented with digital circuits. In some further embodiments, the digital circuits include a counter. The counter is configured to count up and/or down when receiving the adjust signal VA, in order to generate different control signals EN[1]-EN[N].

The arrangements of the controller 542D are given for illustrative purposes only. Various arrangements of the controller 542D are within the contemplated scope of the present disclosure.

The switches Q3[1]-Q3[N] are biased by the voltage VDIO. The switches Q3[1]-Q3[N] are coupled in parallel with each other. The switches Q3[1]-Q3[N] are coupled between the current source 142B and a voltage source that provides the voltage VDIO. In some embodiments, each of the switches Q3[1]-Q3[N] is implemented with one or more transistors. The switches Q3[1]-Q3[N] are configured to be turned on according to the control signals EN[1]-EN[N], to generate testing currents I[1]-I[N] to the node N1, respectively. In some embodiments, the values of the testing currents I[1]-I[N] are configured to be about the same as each other. Thus, when the number of the turned-on switches of the Q3[1]-Q3[N] increases, the sum of the testing currents I[1]-I[N] flowing through the node N1 is increased. If the sum of the testing currents I[1]-I[N] is different from the reference current IREF, a voltage drop, i.e., the sensing voltage VS is accordingly generated. As described above, in some embodiments, the control signal generator 542 is configured to operate as a feedback circuit. For illustration of FIG. 5, the sensing voltage VS is configured to be a feedback signal of the comparator 542C. With such arrangement, the sum of the testing currents I[1]-I[N] is able to be adjusted to be about the same as the reference current IREF, and thus the values of the control signals EN[1]-EN[N] are determined.

With continued reference to FIG. 5, in some embodiments, the current generating circuit 544 includes driving branches 544A. Each of the driving branches 544A includes switches Q4[1]-Q4[N], the switches T1, and the switches T2. The switches Q4[1]-Q4[N] are coupled to a corresponding switch T3 and a corresponding circuit cell 160. The switches Q4[1]-Q4[N] are biased by the voltage VDIO. In each of the driving branches 544A, first terminals of the switches Q4[1]-Q4[N] are coupled to the voltage source that provides the voltage VDIO, and second terminals of the switches Q4[1]-Q4[N] are coupled a corresponding switch T1. Control terminals of the switches Q4[1]-Q4[N] are configured to receive the control signals EN[1]-EN[N], respectively. The switches Q4[1]-Q4[N] are configured to be turned on according to the control signals EN[1]-EN[N], to generate the auxiliary signal IAC. The arrangements of the switches T1-T2 are the same as the arrangements illustrated in FIG. 2 above, and the thus the detailed descriptions are not given here.

In some embodiments of FIG. 5, after the sum of the testing currents I[1]-I[N] is adjusted to be about the same as the reference current IREF, the comparator 542C and the current source 142B are configured to be turned off. As described above, after the sum of the testing currents I[1]-I[N] is adjusted to be about the same as the reference current IREF, the values of the control signals EN[1]-EN[N] are determined. Accordingly, the switches Q4[1]-Q4[N] are then able to generate the auxiliary signal IAC according to the determined control signals EN[1]-EN[N]. Thus, the comparator 542C and the current source 142B are able to be turned off after the control signals EN[1]-EN[N] are determined. As a result, the power consumption of the device 500 in FIG. 5 is further saved.

Figure 6:
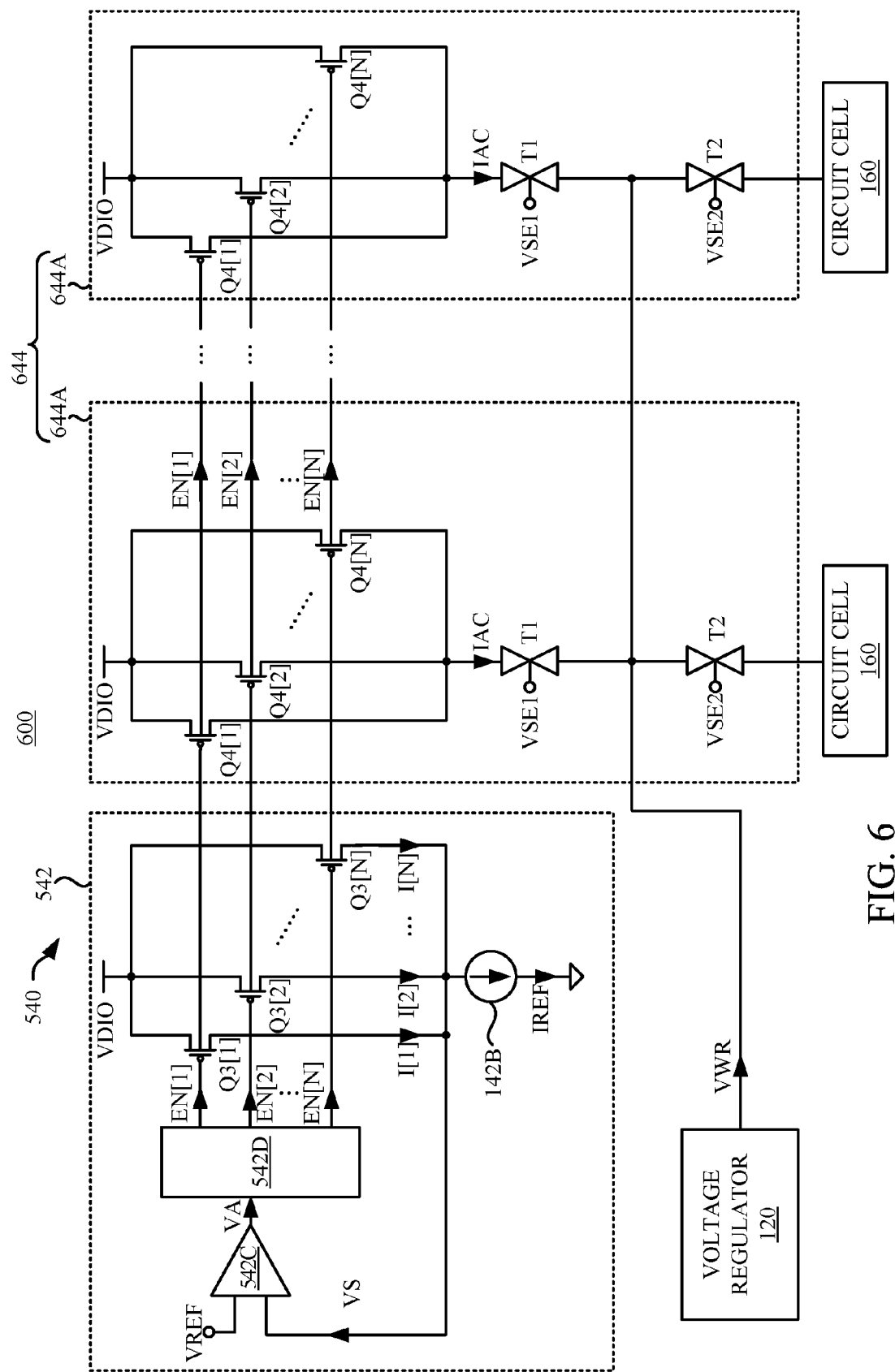
FIG. 6 is a circuit diagram of a device, in accordance with some alternative embodiments of the present disclosure.

Reference is now made to FIG. 6. FIG. 6 is a circuit diagram of a device 600, in accordance with some alternative embodiments of the present disclosure. With respect to the embodiments of FIG. 1, FIG. 2, and FIG. 5, like elements in FIG. 6 are designated with the same reference numbers for ease of understanding.

In some embodiments of FIG. 6, compared with the device 500 in FIG. 5, auxiliary signal generator 540 of the device 600 includes the control signal generator 542 and a current generating circuit 644. The current generating circuit 644 includes driving branches 644A. The switches T1 of the driving branches 644A are coupled between the output terminal of the voltage regulator 120 and the second terminals of the switches Q4[1]-Q4[N]. The switches T2 of the driving branches 644A are coupled between the output terminal of the voltage regulator 120 and the circuit cells 160. In other words, as illustrated in FIG. 6, the switch T1 is configured to be turned on according to the select signal VSE1, to transmit the auxiliary signal IAC to the output terminal of the voltage regulator 120. The switch T2 is configured to be turned on according to the select signal VSE2, to transmit both of the auxiliary signal IAC and the write voltage VWR to the corresponding circuit cell 160. Effectively, the circuit cells 160 are able to be programmed according to both of the auxiliary signal IAC and the write voltage VWR. The related configurations of the auxiliary signal generator 540 in FIG. 6 are the same as the auxiliary signal generator 540 in FIG. 5. Therefore, the repetitious descriptions are not given here.

For ease of understanding, the embodiments illustrated above are described with an example in which one circuit cell 160 is selected to be programmed. In various embodiments, various numbers, including, for example, any integer greater than or equal to 1, of the circuit cells 160 are selected to be programmed are able to be applied to the devices 100, 400, 500, and 600. For example, in some other embodiments, two auxiliary signals IAC are able to be generated by two driving branches 144A in FIG. 2 when two of the circuit cells 160 are selected to be programmed.

The arrangements of the devices 100, 400, 500, and 600 are given for illustrative purposes only. Various arrangements of the devices 100, 400, 500, and 600 are with the contemplated scope of the present disclosure. For example, in some other embodiments, the devices 100, 400, 500, and 600 are able to be implemented with N-type transistors.

In this document, the term "coupled" may also be termed as "electrically coupled," and the term "connected" may be termed as "electrically connected". "Coupled" and "connected" may also be used to indicate that two or more elements cooperate or interact with each other.

In some embodiments, a device is disclosed that includes a voltage regulator, an auxiliary signal generator, and a circuit cell. The voltage regulator is configured to output a write voltage. The auxiliary signal generator is configured to output an auxiliary signal. The circuit cell is configured to receive both of the write voltage and the auxiliary signal according to a first select signal and a second select signal.

Also disclosed is a method that includes the operation below. A write voltage is generated by a voltage regulator. An auxiliary signal is generated by an auxiliary signal generator. Both of the write voltage and the auxiliary signal are transmitted to a first circuit cell of the circuit cells.

Also disclosed is a device that includes a voltage regulator, circuit cells, and driving branches. The voltage regulator is configured to output a write voltage. The driving branches are configured to generate auxiliary signals to the circuit cells, respectively. Each of the circuit cells is configured to be programmed according to both of the write voltage and a corresponding auxiliary signal of the auxiliary signals.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a circuit cell;
   a voltage regulator configured to output a write voltage; and
   an auxiliary signal generator configured to output an auxiliary signal, the auxiliary signal generator comprising a first plurality of switching units configured to transmit the write voltage and the auxiliary signal to the circuit cell on condition that the circuit cell is to be programmed.

2. The device of claim 1, wherein the auxiliary signal generator comprises:
   a control signal generator configured to output a control voltage according to a reference voltage and a reference current; and
   a current generating circuit, which comprises the first plurality of switching units, configured to generate the auxiliary signal, and transmit the auxiliary signal to the circuit cell according to a first select signal and a second select signal.

3. The device of claim 2, wherein the control signal generator comprises:
   an amplifier configured to generate the control voltage according to the reference voltage and a sensing voltage at a node;
   a current source coupled to the node, and configured to generate the reference current; and
   a first switching unit coupled to the current source at the node, and configured to generate the sensing voltage according to the control voltage.

4. The device of claim 2, wherein the current generating circuit further comprises:
   a second switching unit configured to generate the auxiliary signal according to the control voltage,
   wherein the first plurality of switching units comprise:
   a third switching unit configured to transmit the auxiliary signal to the circuit cell according to the first select signal; and
   a fourth switching unit configured to transmit the write voltage to the circuit cell according to the second select signal.

5. The device of claim 4, wherein the fourth switching unit is further configured to transmit both of the write voltage and the auxiliary signal to the circuit cell according to the second select signal.

6. The device of claim 1, wherein the auxiliary signal generator comprises:
   a control signal generator configured to output a plurality of control signals according to a reference voltage and a reference current; and
   a current generating circuit, which comprises the first plurality of switching units, configured to generate the auxiliary signal according to the control signals, and transmit the auxiliary signal to the circuit cell according to a first select signal and a second select signal.

7. The device of claim 6, wherein the control signal generator comprises:
   a comparator configured to compare the reference voltage with a sensing voltage at a node, to output an adjust signal;
   a controller configured to generate the control signals according to the adjust signal;
   a plurality of first switching units configured to generate a plurality of testing currents to the node, to generate the sensing voltage; and
   a current source coupled to the node, and configured to generate the reference current.

8. The device of claim 6, wherein the current generating circuit further comprises:
   a plurality of second switching units configured to generate the auxiliary signal according to the control signals,
   wherein the first plurality of switching units comprise:
   a third switching unit configured to transmit the auxiliary signal to the circuit cell according to the first select signal; and
   a fourth switching unit configured to transmit the write voltage to the circuit cell according to the second select signal.

9. The device of claim 8, wherein the fourth switching unit is further configured to transmit both of the write voltage and the auxiliary signal to the circuit cell according to the second select signal.

10. The device of claim 7, wherein the current source and the comparator are configured to be turned off when a sum of the testing currents is about the same as the reference current.

11. A method, comprising:
    generating, by a voltage regulator, a write voltage;
    generating, by an auxiliary signal generator, an auxiliary signal; and
    transmitting, by a first plurality of switching units, the write voltage and the auxiliary signal to a first circuit cell of a plurality of circuit cells on condition that the first circuit cell is to be programmed.

12. The method of claim 11, wherein generating the auxiliary signal comprises:
    generating, by an amplifier, a control voltage according to a reference voltage and a sensing voltage at a node; and
    generating, by a second switching unit of the auxiliary signal generator, the auxiliary signal according to the control voltage,
    wherein the sensing voltage is generated by a first switching unit according to the control voltage and a reference current.

13. The method of claim 12, wherein transmitting the write voltage and the auxiliary signal to the first circuit cell comprises:
    turning on, by a first select signal, a third switching unit of the first plurality of switching units to transmit the auxiliary signal to the first circuit cell; and turning on, by a second select signal, a fourth switching unit of the first plurality of switching units to transmit the write voltage to the first circuit cell.

14. The method of claim 11, wherein generating the auxiliary signal comprises:
   generating, by a comparator, an adjust signal according to a reference voltage and a sensing voltage at a node;
   generating, by a controller, a plurality of control signals according to the adjust signal;
   generating, by a plurality of first switching units, a plurality of testing currents to the node, to generate the sensing voltage, wherein a current source is configured to generate a reference current flowing from the node to ground; and
   generating, by a plurality of second switching units, the auxiliary signal according to the control signals.

15. The method of claim 14, further comprising:
   turning off the comparator and the current source when a sum of the testing currents is about the same as the reference current.

16. A device, comprising:
   a voltage regulator configured to output a write voltage;
   a plurality of circuit cells; and
   a plurality of driving branches configured to generate a plurality of auxiliary signals to the circuit cells, respectively,
   wherein each of the driving branches comprises a first plurality of switching units, and each of the circuit cells is configured to be programmed according to both of the write voltage and a corresponding auxiliary signal of the auxiliary signals transmitted from the first plurality of switching units.

17. The device of claim 16, wherein each of the driving branches further comprises:
   a first switching unit configured to generate the corresponding auxiliary signal according to a control voltage,
   wherein the first plurality of switching units comprises:
   a second switching unit configured to transmit the corresponding auxiliary signal to a corresponding one of the circuit cells according to a first select signal; and
   a third switching unit configured to transmit the write voltage to the corresponding one of the circuit cells according to a second select signal.

18. The device of claim 17, further comprising:
   an amplifier configured to generate the control voltage according to a reference voltage and a sensing voltage at a node;
   a current source configured to generate a reference current flowing from the node to ground; and
   a fourth switching unit coupled to the current source at the node, and configured to generate the sensing voltage according to the control voltage.

19. The device of claim 16, wherein each of the driving branches comprises:
   a plurality of first switching units configured to generate the corresponding auxiliary signal according to a plurality of control signals,
   wherein the first plurality of switching units comprise:
   a second switching unit configured to transmit the corresponding auxiliary signal to a corresponding one of the circuit cells according to a first select signal; and
   a third switching unit configured to transmit the write voltage to the corresponding one of the circuit cells according to a second select signal.

20. The device of claim 19, further comprising:
   a comparator configured to compare a reference voltage with a sensing voltage at a node, to output an adjust signal;
   a controller configured to generate the control signals according to the adjust signal;
   a plurality of fourth switching units configured to generate a plurality of testing currents to the node, to generate the sensing voltage; and
   a current source configured to generate a reference current flowing from the node to ground.

* * * * *